May 28, 1968 G. W. PIERCE 3,384,955

CIRCUIT BOARD PACKAGING TECHNIQUES

Filed Nov. 4, 1964 2 Sheets-Sheet 1

Glenn W. Pierce,
INVENTOR.
BY.
[signature]
AGENT.

Glenn W. Pierce,
INVENTOR.
BY.
[signature]
AGENT.

United States Patent Office 3,384,955
Patented May 28, 1968

3,384,955

CIRCUIT BOARD PACKAGING TECHNIQUES

Glenn W. Pierce, Los Angeles, Calif., assignor to TRW Inc., a corporation of Ohio Filed Nov. 4, 1964, Ser. No. 409,004
3 Claims. (Cl. 29—624)

ABSTRACT OF THE DISCLOSURE

A standardized format approximating the size of an IBM card is used as the means for holding small electrical dot or pellet components. The location and terminals for a given circuit, which includes at least one of the dot or pellet electrical components, are printed on a Mylar card having a size approximating that of an IBM card. The printed Mylar card is located in the base of a jig and the individual dot or pellet components are coated with cement and placed on the Mylar card in their appropriate locations according to the marks contained thereon. Cement is placed over each of the components and the jig closed. A suitable resin which ultimately forms the substrate of the finished board is injected into the mold and cured. After completing the curing the jig is opened and the cement portions on both top and bottom are removed. The resulting form comprises a substrate containing dot or pellet components with suitable terminal areas exposed for the deposition of conductive surfaces on the substrate used for interconnecting and completing the desired circuitry to the electrical components.

This invention relates to improved circuit packaging techniques and more particularly to improved techniques for using dot or pellet electrical components.

Dot or pellet electrical components henceforth called pellet, are presently being manufactured by such diverse groups as King Electronics, Inc., South Pasadena, Calif.; P. R. Mallory and Co., Inc., Indianapolis, Ind.; Micro-electron, Inc., Santa Monica, Calif.; and many others. The handling of the individual pellet components is presently being organized in industry to conform to a fixed standard. For example, one preferred suggestion under consideration is to mount the individual pellet component in an IBM card that contains the necessary electrical descriptions as well as the part itself. The individual pellet component is presently available as a resistor, capacitor, coil, and transistor. Electrical connections to the pellet components for a two terminal connection are made on each side of the pellet. The transistor configuration being a three terminal device has a collector connection on one side and the emitter and base connection on the other side.

This invention is concerned with the assembling of a plurality of individual pellet components into a circuit board that not only holds the pellets but also provides electrical interconnections between the pellets. The improvements presented herein are best understood by reviewing present day techniques. In the art today, a circuit board having a desired external dimension and thickness is constructed of a suitable epoxy substrate. Individual locations for the pellets are determined and the substrate drilled to a size slightly larger than the pellet to be accommodated. The substrate is located on a flat surface and holes in the substrate for accommodating the pellets are coated with a suitable cement. The individual pellets are then located in the holes. The problems associated with the aforesaid method are a result of the tolerance variations on the outside dimension of the pellet component. These wide variations in pellet diameters require the hole being drilled in the substrate to be larger than the largest size expected. The amount of adhesive needed therefore varies as a function of the variation in diameter of the pellet and the actual hole size. Should the fit be tight, it is possible to either damage the component when inserted into the hole or to squeeze the needed adhesive from the hole to the flat surface supporting the substrate. If too much adhesive is removed, the component will not remain in the board and may be lost. On the other hand. if adhesive is forced on to the flat plate, it may be impossible to insert the component into the hole against the pressure of the excess adhesive. Of course, in this situation, it is possible to remove the flat plate and also remove excess adhesive before returning the substrate to the flat plate. However, in this case, assuming sufficient adhesive remains on the periphery of the hole to hold the pellet component in place, variations in the height of the pellet will cause an additional problem. Height variation between pellets are due to the physical size variations in the kinds of components used as well as tolerance variations. A pellet inserted into a hole and against the flat surface supporting the substrate will produce a substrate that is flat on one side and uneven on the other. The difference in height is an amount equal to the full difference in height between the smallest and largest pellet components used.

In this invention, the difficulties associated with varying thicknesses of components due to either variations in tolerances or variations in size of components is completely eliminated. In addition, variations in pellet component heights resulting in a board being flat on one side and uneven on the other is now controlled to an extent in which the height variation caused by different sized components is now half that presented by the prior art. These advantages are achieved by using a Mylar polyester card or similar material which contains a print of the pellet component placement and layout desired in the final substrate. The location of the individual pellet components are then coated with a thin filament of adhesive such as rubber cement of sufficient strength to retain the components during subsequent pressing but not strong enough to prevent subsequent disassembly of the Mylar card locator at a later time. The individual components are then located in their appropriate place and a second layer of rubber cement is located on the top of each component. The complete assembly is located in a mold having the desired shape and thickness which is then filled with epoxy resin of the desired type. The resin used may be either catalyzed or not and may be cured at room temperature or at elevated temperatures. After being cured, the substrate is removed from the mold and the Mylar print is discarded. Both sides of the substrate are then cleaned to remove any residue of cement. Multi-layer circuitry may then be deposited on both sides of the substrate to complete the electrical connection.

Further objects and advantages will be made more apparent by referring now to the accompanying drawings wherein.

Figure 5:
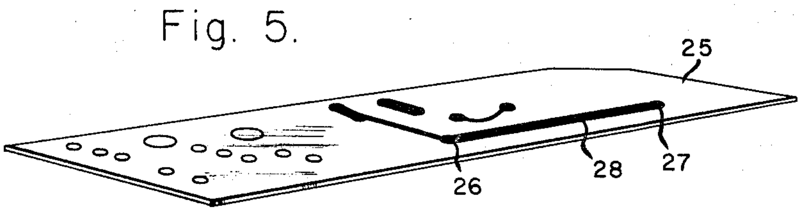

FIGURES *4a* and *4b* illustrate a finished substrate having the dot or pellet components embedded therein; and FIGURE 5 illustrates a finished circuit board containing printed circuitry for electrically interconnecting the components.

Figure 1:
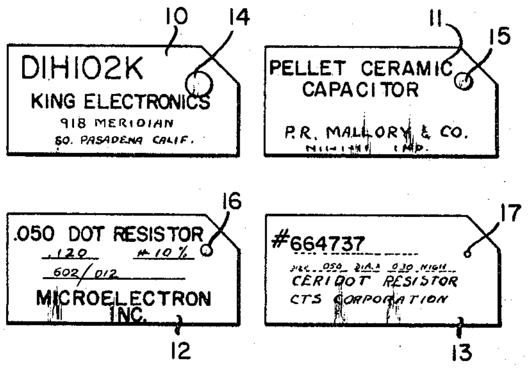
FIGURE 1 illustrates the packaging of dot or pellet components on IBM cards.

Referring now to FIGURE 1, there is shown a plurality of IBM cards 10, 11, 12 and 13 which contain the electrical component and description of that component. Card 10, for example, contains a dot component 14 whereas card 11 contains a pellet ceramic capacitor 15, card 12 contains a dot resistor 16 and card 13 also contains a dot resistor 17 but of different manufacture. Once the design of the complete circuit board is finalized, the actual IBM cards 10, 11, 12 and 13 serve the purpose of inventory control and identification of the parts themselves since the part and the card are always together.

Figure 2:
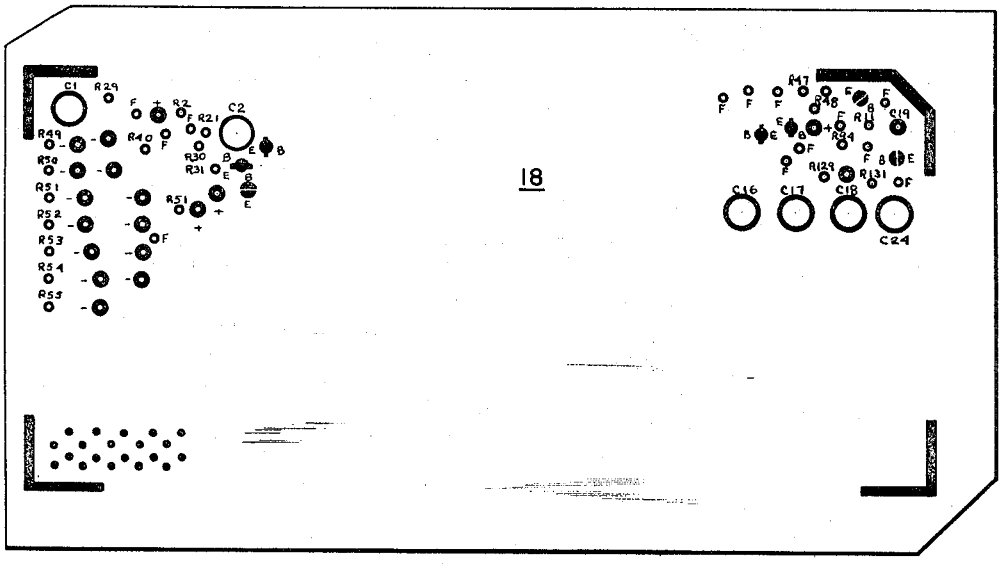
FIGURE 2 illustrates a Mylar card having the marked location of the component parts.

In accordance with the method described, a Mylar card 18 illustrated in FIGURE 2 and having the desired dimensions of the finished circuit board is constructed. The Mylar card 18 contains a printed location of all of the individual dot or pellet components as indicated. The printing may be achieved by photographic or silk screen process or any other process which will accurately mark the location of the finished part on the Mylar card.

Figure 3:
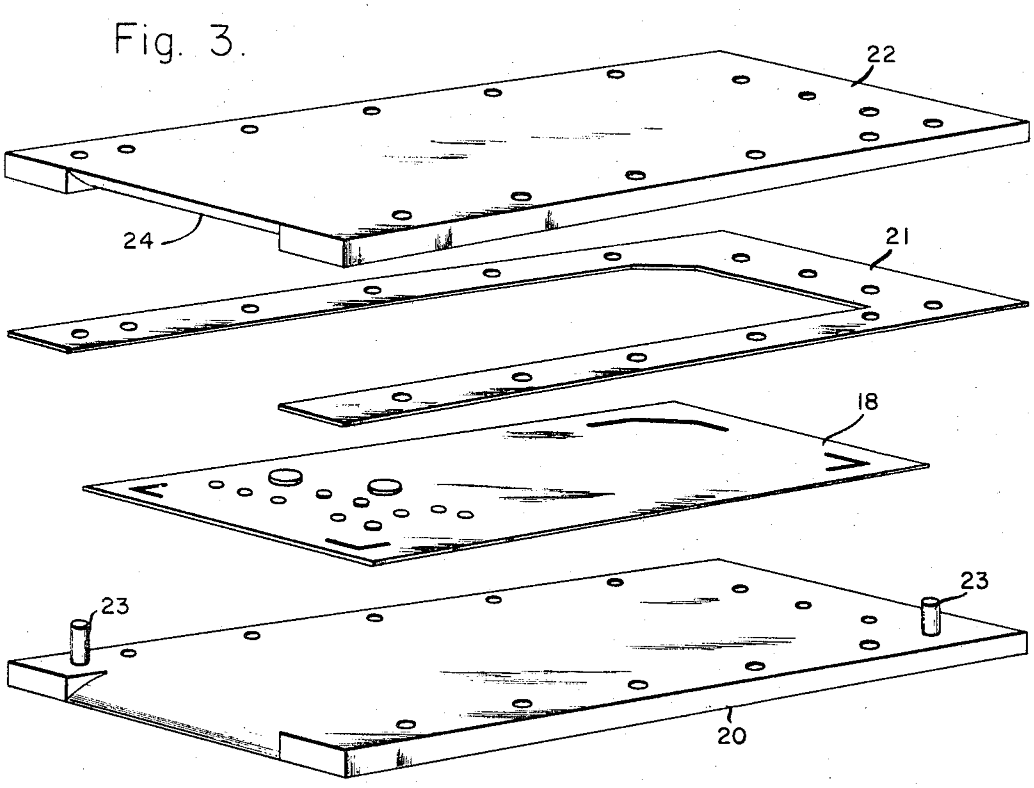
FIGURE 3 illustrates an exploded view of the press assembly used to construct a substrate assembly.

Referring now to FIGURE 3, there is shown a press comprising a bottom-most portion 20, a spacer 21 having the desired thickness of the resultant circuit board and an uppermost portion 22. The bottom-most portion 20 contains a plurality of pins 23 for accurately aligning the assembly together. In using the press, the Mylar card 18 is registered on the lowermost portion 20 and within the framework of the spacer 21 to thereby determine the metes and bounds of the resultant board. The operator, in the preferred method, individually coats the Mylar card with an adhesive for example, rubber cement, on the individual marked locations that will contain the dot or pellet components. The individual electrical components are then located and adhesively secured or in place as marked on the Mylar card 18. Another coating of rubber cement is placed on the upper-most portion of the electrical component. The upper-most portion of the press or closure 22 contains a plastic finished surface 24 for contacting or being adhered to by the rubber cement on the electrical components thereby fixedly holding the electrical components in place between the Mylar card 18 and the upper-most portion 22.

The press, which is actually a mold, is then filled with an epoxy resin of the desired type required in the finished board. The resin may be either catalyzed or not and may be cured at room temperature or elevated temperatures as mentioned previously. After the curing step, which will be determined by the specific resin used, the resulting substrate is removed from the mold and the Mylar card 18 discarded.

Figure 4A:
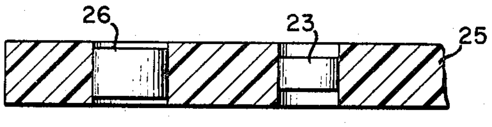
Figure 4B:
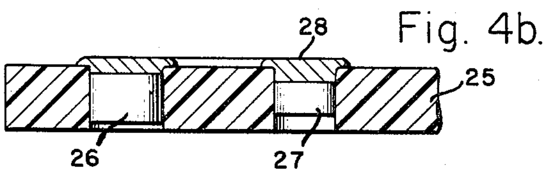

FIGURES 4*a* and 4*b* illustrate a cross section of a substrate 25 with the individual electrical components in place. The actual circuit connections are then made to both sides of the substrate in order to complete the electrical connections between the dot or pellet components.

FIGURE 4*a* more fully illustrates how the electrical component, dot or pellet, becomes centrally located within the substrate 25. The differences in height between elements 26 and 27 are exaggerated in order to illustrate the benefits to be derived from practicing this invention. FIGURE 4*b* illustrates a portion of electrical wiring 28 that may be used to interconnect the electrical components.

FIGURE 5 illustrates a typical circuit board containing dot or pellet components located on a substrate constructed according to the teachings of this invention. The electrical wiring may be constructed by electron deposition techniques, printed circuitry, or even conductive tape. The actual wiring used does not form part of this invention since any well known process or technique may be used to complete the circuit board.

This completes the description of the embodiment of the invention illustrated herein. However, many modifications and advantages thereof will be apparent to persons skilled in the art without departing from the spirit and scope of this invention. Accordingly, it is desired that this invention not be limited to the particular details of the embodiment disclosed herein, except as defined by the appended claims.

The embodiments of the invention in which an exclusive property or privilege is claimed are defined as follows:

1. A method of packaging dot or pellet electrical components having conductive terminal end portions that comprises the steps of:

preparing a marked polymer card illustrating the desired location of the individual electrical components, then locating the card in the bottom-most portion of a mold with the location markings left exposed, then cement coating each of the individual components on both ends and cementing one end portion of each of the cement coated components to the marked card at the marked desired locations while leaving the other coated end of each component exposed, then closing the mold causing the cement on the exposed component ends to be adhered to the mold closure and the components to be fixedly supported in same, then filling the mold with suitable curable substrate material, then curing the substrate and removing the component containing substrate from the mold, then cleaning the adhesive from the components, and then depositing selective conductive films on the substrate in electrical connecting relation with the cleaned component terminal end portions.

2. A method of packaging dot or pellet electrical components having conductive terminal end portions that comprises the steps of:

preparing a polymer card containing the marked location of the individual components, then locating the card in the bottom-most portion of a mold with the location markings left exposed, then adhesively securing at least one said end portion of each of the individual components to said card where marked by using adhesive material while leaving the top portion of each component exposed, then placing additional adhesive material on the exposed top portion of each of the components, then closing the mold causing the adhesive material on the component top portions thereof to be adhered to the mold closure and the components to be fixedly supported in same, then filling the mold with suitable curable substrate material, then curing the substrate material and removing the component containing substrate from the mold, then cleaning the adhesive from the components, and then depositing selective conductive films on the substrate in electrical connecting relationship with the cleaned component terminal portions.

3. A method of packaging dot and pellet electrical components having conductive terminal end portions that comprises the steps of:

preparing a Mylar card containing the marked location of the individual components, then locating the card in the bottom-most portion of the mold with the location markings left exposed, then cementing at least one said end portion of each of the individual components to said card where marked by using rubber cement, then placing additional cement on the top portion of each of the components, then closing the mold causing the cement on the component top portions thereof to be adhered to the mold closure and the components to be fixedly supported in same.

then filling the mold with curable epoxy substrate material, then curing the substrate material and removing the component containing substrate from the mold, then cleaning the cement from the components, and then depositing selective conductive films on the substrate in electrical connecting relationship with the cleaned component end terminal portions.

References Cited

UNITED STATES PATENTS

| | | | |
|---|---|---|---|
| 3,242,556 | 3/1966 | Broughton | 264—277 |
| 3,026,575 | 3/1962 | Luster | 264—261 |
| 3,239,981 | 3/1966 | Fitzgerald | 264—261 |
| 3,131,514 | 5/1964 | Siek | 264—261 |
| 3,013,370 | 12/1961 | Vida | 264—261 |
| 2,258,885 | 10/1941 | Duke | 264—277 X |
| 418,840 | 1/1890 | Hettich | 264—261 |
| 3,187,068 | 6/1965 | De Veries | 264—261 |

JOHN F. CAMPBELL, *Primary Examiner.*

ROBERT F. WHITE, *Examiner.*

R. W. CHURCH, R. B. MOFFITT, *Assistant Examiners.*